United States Patent [19]

Blomley

[11] Patent Number: 4,502,018
[45] Date of Patent: Feb. 26, 1985

[54] GAIN REGULATION CIRCUIT FOR AN AMPLIFIER CIRCUIT

[75] Inventor: Peter F. Blomley, Bishop's Stortford, England

[73] Assignee: International Standard Electric Corporation, New York, N.Y.

[21] Appl. No.: 491,688

[22] PCT Filed: Mar. 4, 1982

[86] PCT No.: PCT/GB82/00070
§ 371 Date: May 5, 1983
§ 102(e) Date: May 5, 1983

[87] PCT Pub. No.: WO83/03177
PCT Pub. Date: Sep. 15, 1983

[51] Int. Cl.³ .......................... H03F 3/45; H03G 3/30
[52] U.S. Cl. ..................................... 330/254; 330/256
[58] Field of Search ....................... 330/254, 256, 278; 333/17 M, 32

[56] References Cited

U.S. PATENT DOCUMENTS 3,940,708  2/1976  Sumi et al. ........................ 330/254

FOREIGN PATENT DOCUMENTS 2037695  2/1972  Fed. Rep. of Germany ...... 330/254

Primary Examiner—James B. Mullins
Assistant Examiner—Steven J. Mottola
Attorney, Agent, or Firm—John T. O'Halloran

[57] ABSTRACT

A gain regulation circuit e.g. for a telephone subscriber's instrument, includes a plurality (2n+1) of long tailed transistor pairs one of which has a significantly higher gain than the remainder (2n). The circuit may be adjusted to a composite gain value between limits defined by the high and low gain pairs by providing a suitably weighted combination of these pairs. Typically, this weighting is achieved by control currents fed into the tail circuits of the pairs.

8 Claims, 6 Drawing Figures

GAIN REGULATION CIRCUIT FOR AN AMPLIFIER CIRCUIT

BACKGROUND OF THE INVENTION

This invention relates to electronic amplifier circuits having a regulatable gain, and in particular to a gain regulation circuit for use in a telephone instrument and whereby the gain of the instrument speech paths may be adjusted e.g. for matching the receiver gain to the line loop impedance.

An electronic telephone instrument includes an amplifying speech path whereby speech signals are relayed from the instrument microphone to the line and from the line to the instrument receiver. It will be appreciated that for optimum performance of the instrument the receiver and transmitter speech paths must each include some means of gain regulation to prevent overloading and to provide matching of the receiver gain to the line impedance. The line or loop impedance is in general proportional to the length of the subscriber loop between the instrument and the exchange and can thus have any value within a clearly defined range. Because it is necessary to cater for a wide variation of loop length, it is essential that the receiver circuit of the subscriber's instrument incorporates provision for line length compensation. To compensate loop length variations many telephone administrations require the provision of receiver circuits that can be set to a gain figure anywhere between upper and lower preset limits.

Furthermore, in order to prevent overloading and consequent saturation of the transmitter output state to the line it is necessary to provide some form of gain control whereby a speech signal waveform may be limited in amplitude. This technique commonly known as soft clipping is described in my co-pending application Ser. No. 491,834, filed May 5, 1983.

A particularly useful variable gain element is the transistor long tailed pair the gain of which can be determined by controlling the common emitter current of the pair. The use of a single long tailed pair is, however, somewhat restricted by its significantly non linear signal/gain characteristic which gives rise to distortion for all but very low signal levels. In some applications this distortion may be outside the limits specified by the telephone administration.

SUMMARY OF THE INVENTION

The object of the present invention is to provide a gain regulation circuit whereby a smooth and continuous gain variation between predefined limits in response to a control signal may be effected.

According to the invention there is provided a signal amplifier element having a controllable gain and comprising a plurality of transistor long tailed pairs, wherein the transistors of the pairs are so constructed that the maxima of the signal/gain characteristics of the pairs are symmetrically disposed about the signal zero level, and wherein the signal/gain characteristic of all the pairs acting in combination includes a substantially constant region.

According to another object of the invention there is provided a gain regulator and signal amplifier circuit e.g. for an electronic telephone subset, the circuit comprising a first long tailed pair of transistors having substantially identical characteristics, and 2n further long tailed pairs of transistors, where n is an integer including unity, wherein corresponding transistors of the 2n further pairs have emitter areas in the ratio 1:a; a:1; where a lies between zero and unity, whereby the gain maxima of the characteristics corresponding to the further long tailed pairs are symmetrically disposed about the signal zero so as to provide together a substantially constant gain region of significantly lower gain than the gain maxima of the first long tailed pair, and wherein the circuit includes control means whereby weighted contributions to the circuit gain characteristic may be provided from the first pair and from the 2n further pairs so as to provide a stage gain adjustable between limits defined by the gain of the first pair and the gain of the 2n further pairs. We have found that by providing an emitter area mismatch between the transistors of a long tailed pair the maxima of the signal/gain characteristic is off-set from the signal zero by a voltage V such that $$V = (kt/q) \log x$$

where k is Boltzman's constant, t is the absolute temperature, q is the electronic charge and x is the ratio of emitter areas. By combining a plurality of suitably offset long tailed pairs with a further balanced pair, a composite characteristic having a gain smoothly adjustable between two defined gain limits is obtained. The term gain as employed herein is understood to include values of less than unity.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
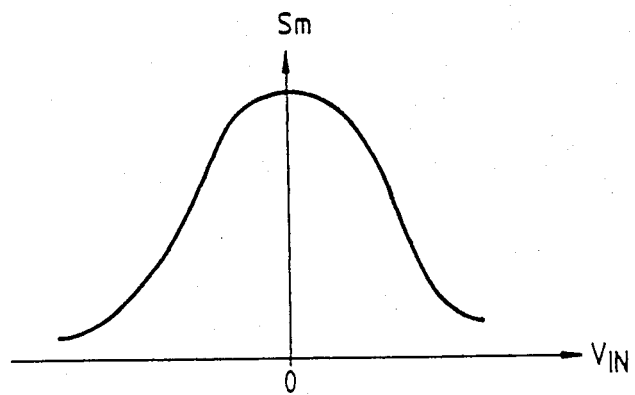
FIG. 1 illustrates the signal/gain characteristic of a conventional balanced transistor long tailed pair.

Referring to FIG. 1, the signal/gain characteristic of a conventional transistor long tailed pair is shown.

As will be well known to those skilled in the art the gain g of a balanced, i.e. a symmetrical long tailed pair is defined by $$g = \frac{q I}{4 kt} \operatorname{sech}^2 \frac{q V_{in}}{2 kt} \tag{1}$$

where q is the electronic charge, I is the tail current of the pair, k is Boltzman's constant, t is the absolute temperature and Vin is the instantaneous input signal level. As can be seen the characteristic has the appearance of a somewhat distorted inverted U and it will thus be apparent that low distortion amplification is achieved only for a small input signal voltage swing. For small input signals the circuit has substantially unit gain.

Figure 2:
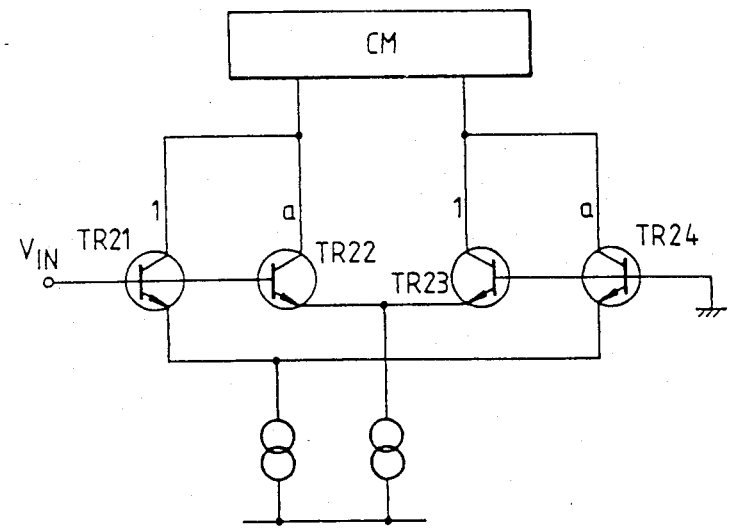
FIG. 2 shows an amplifier element comprising two long tailed transistor pairs provided with emitter area imbalance.
Figure 3:
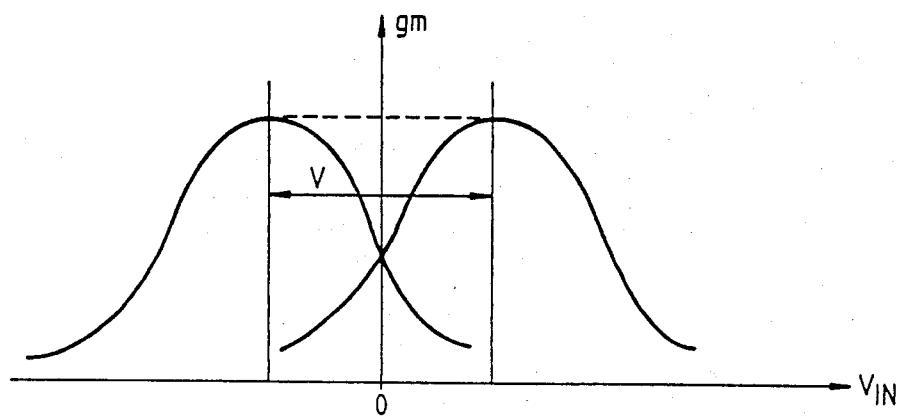
FIG. 3 illustrates the signal/gain characteristic of the circuit of FIG. 2.

In the circuit shown in FIG. 2 two long tailed pairs TR21,TR24 and TR22,TR23 are employed. The transistors of the two pairs are designed such that their emitter areas are in the ratio 1:a and a:1 where a is a number between zero and unity. This offsets the gain maxima of the two pairs to opposite sides of the input signal zero level as shown in FIG. 3. The voltage separation V between the two maxima is given by the equation $$V = (2kt/q) \log a$$

where k is Boltzman's constant, t is the absolute temperature and q is the electronic charge. The resultant gain characteristic of the two pairs is shown by the dashed line in FIG. 3. With a suitable choice of the area ratio a, typically from (1/5) to (1/12), the characteristic has a substantially constant region of gain a, less than unity, extending V on either side of the signal zero. This considerably enhances the low distortion signal handling capability of the circuit as compared to a conventional single long tailed pair amplifier. In this circuit, gain has been traded for signal handling capability.

Figure 4:
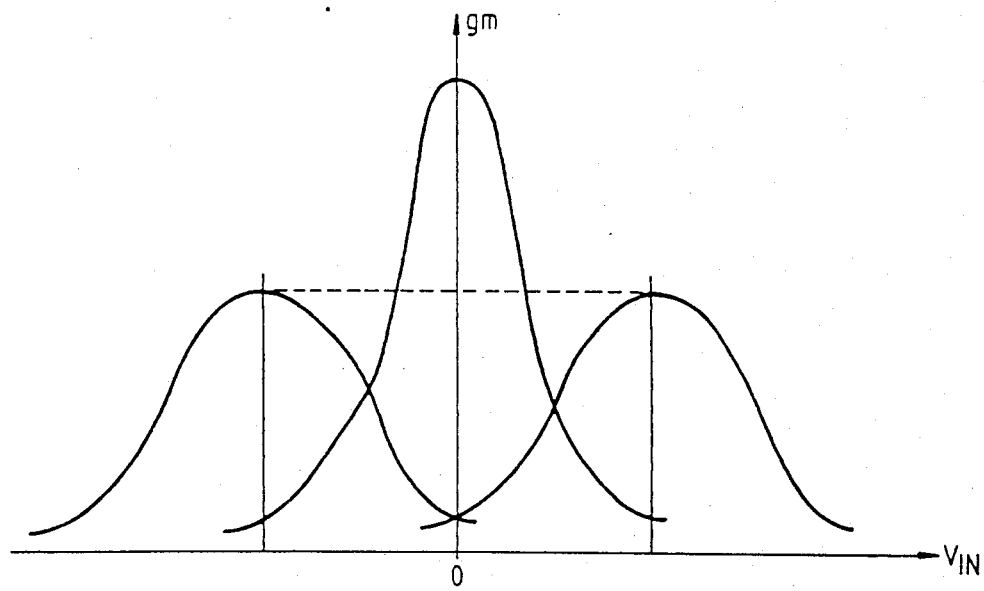
FIG. 4 illustrates the extension of the characteristic offset technique to three or more pairs.
Figure 5:
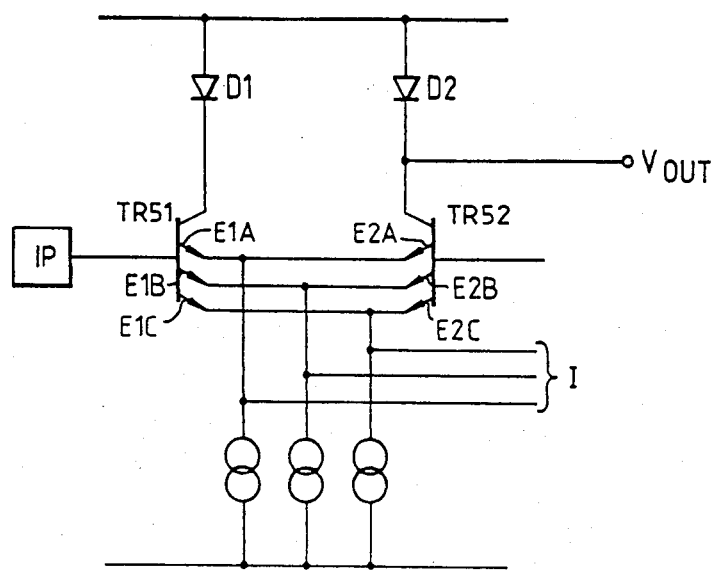
FIG. 5 shows a telephone receiver gain regulation circuit embodying the techniques of FIGS. 1 and 4.

The technique of FIGS. 1, 2 and 3 can be combined as shown in FIGS. 4 and 5. FIG. 4 illustrates the gain characteristics of a circuit comprising three long tailed pairs wherein the respective emitter area ratios of the pairs of transistors are 1:a; 1:1 and a:1. As can be seen from FIG. 4 the circuit can be set in a high (unit) gain condition wherein the balanced long tailed pair acts as the major amplifying element, or to a low (a) gain condition wherein the unbalanced long tailed pairs act as the major amplifying element. Weighted combinations of these two states can be employed to provide any gain value between these limits. In the same way the technique can be extended to the use of five, or in general (2n+1), long tailed pairs, i.e. one balanced pair and 2n unbalanced pairs. It will of course be clear that in general that in any application the final design will be a trade off between linearity and circuit complexity. The ratio 1:a is increased for each subsequent pair.

Although the techniques have been described in terms of discrete transistors it is, in many applications, advantageous to replace the individual pairs of transistors by a single pair of multi-emitter transistors, each pair of emitters corresponding to one long tailed pair.

An application of the techniques described herein is shown in FIG. 5 of the accompanying drawings which is a circuit diagram of a gain regulation circuit stage e.g. for the receiver speech path of an electronic telephone subset. The circuit output is coupled to the line via a further linear amplifier stage (not shown). In order to comply with the design specifications of most telephone administrations, it is necessary to provide some means of gain control to compensate for the range of different line loop lengths between the exchange and the subscribers. Typically, the gain must be variable between two limits which represent the 'best case' and 'worst case' loop lengths. The gain must be continuously and smoothly variable between these limits. A circuit which satisfies these constraints is shown in FIG. 5.

Referring to FIG. 5, the gain regulation circuit provides an accurately defined gain of any value between first and second predetermined levels. The circuit comprises first and second multi-emitter transistors TR51 and TR52 arranged in a multiple long-tailed pair configuration. Corresponding pairs of emitters E2A; E1B, E2B; E1C, E2C are each coupled to a corresponding current source I1, I2, I3 arranged in the 'tail circuit' of the pair. The transistor collector loads may be provided by forward biased diodes D1 and D2, which provide temperature compensation of the circuit.

As is well known to those skilled in the art, the impedance R of a diode is given by the expression:

$$R = kt/qI$$

where k is Boltzmann's constant, t is the absolute temperature, q is the electronic charge and I is the current in absolute units. It will be noted that this impedance expression is the temperature dependent term of the gain expression of equation (1) above.

Thus, by providing diode loads in the collector circuits of the long tailed pair transistors a very significant degree of temperature compensation is provided. This compensation is sufficient to provide substantially temperature independent operation throughout the ambient temperature range specified by the various telephone administrations.

The transistors TR51 and TR52 are fabricated such that the first emitters E1A and E2A are of substantially equal area, i.e. they are capable of carrying substantially equal currents. The second pair of emitters E1B, E2B have areas in the ratio 1:a and the third pair E1C, E2C have areas in the ratio a:1, where a is an arbitrary fraction between zero and unity. Such a structure has the property that, in the absence of an input signal, the currents flowing through the respective pairs of emitters are in the ratio 1:1, 1:a and a:1.

The circuit has two gain limits (FIG. 4) of unity and a and is adjustable to any value between these limits. The ratio 1:a is equal to the ratio of the receiver gain value limits specified for the receiver gain value limits specified by the telephone administration. This ensures that the overall gain of the receiver channel can be set to any value within these limits.

In use, the arrangement may provide a gain regulation feedback loop for an amplifier whereby speech signals are output to the line. The bases of the transistors TR51 and TR52 are connected respectively to the speech signal and to a fixed potential. The emitter circuits are fed, via a current amplifier (not shown), with currents corresponding to the line voltage. It will be appreciated that this line voltage is inversely proportional to the subscriber loop impedance. In use, the line impedance is determined from the line voltage and corresponding currents are then fed to the rail circuits of the long tailed pairs to provide a corresponding gain value.

Figure 6:
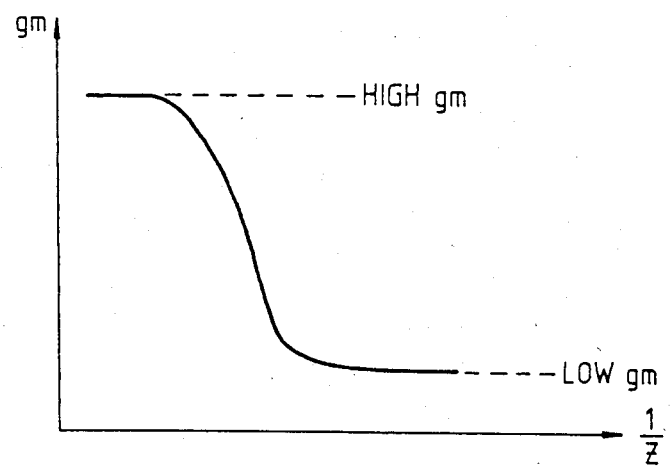
FIG. 6 illustrates the gain characteristics of the circuit of FIG. 5.

The gain condition of the circuit is determined by the weighted contributions of the balanced and unbalanced pairs in the composite output characteristic. By increasing or decreasing currents $I_1$, $I_2$, $I_3$ fed into the tail circuit of the transistor pairs the contribution of each pair can be correspondingly reduced or increased. This provides a smooth transfer, as shown in FIG. 6, from a unit gain condition wherein the balanced pair provides the major contribution to the output signal to a low (a) gain condition where the unbalanced pairs handle the major portion of the signal and the contribution of the balanced pair is reduced substantially to zero. By suitable control of the currents $I_1$, $I_2$, $I_3$ the circuit may be set to any gain value between these two limit conditions.

The arrangement is equivalent to a plurality of long-tailed pairs arranged in parallel, the no-signal balance currents of each pair being defined by the emitter area ratio of the pair.

Advantageously the arrangements described herein may be fabricated in integrated circuit form.

While I have described above the principles of my invention in connection with specific apparatus, it is to be clearly understood that this description is made only by way of example and not as a limitation to the scope of my invention as set forth in the objects thereof and in the accompanying claims.

I claim:

1. A gain regulator and signal amplifier circuit for an electronic telephone subset, said circuit comprising a first long tailed pair of transistors having substantially identical characteristics, and 2n further long tailed pairs of transistors, where n is an integer including unity, wherein corresponding transistors of said 2n further pairs have emitter areas in the ratio 1:a; a:1, where a lies between zero and unity, whereby gain maxima of gain characteristics corresponding to said 2n further pairs are symmetrically disposed about signal zero of a circuit gain characteristic so as to provide together said circuit gain characteristic having a substantially constant gain region of significantly lower gain than gain maxima of said first long tailed pair, and wherein said circuit further includes control means coupled to emitters of said first pair and said 2n further pairs whereby weighted contributions to said circuit gain characteristic may be provided for said first long tailed pair and from said 2n further pairs so as to provide a stage gain adjustable between limits defined by the gain of said first pair and the gain of said 2n further pairs.

2. A circuit as claimed in claim 1, wherein said control means includes means for sensing a telephone line impedance and for generating control signals corresponding to said impedance.

3. A circuit as claimed in claim 1, wherein said control signals comprise currents fed into said emitter of said long tailed pairs.

4. A circuit as claimed in claim 1, wherein said long tailed pairs are provided by two multi-emitter transistors.

5. A circuit as claimed in claim 1, wherein each transistor collector is provided with a forward biased diode load whereby temperature compensation of the circuit is effected.

6. A signal amplifier having a controllable gain and comprising a plurality of transistor long tailed pairs having gain control means coupled to their emitters, wherein the transistors of said pairs are so constructed that the maxima of the signal/gain characteristics of said pairs are symmetrically disposed about the signal zero level of an overall amplifier signal/gain characteristic, and wherein said overall signal/gain characteristic includes a substantially constant region due to said plurality of pairs acting in combination.

7. A signal amplifier element as claimed in claim 6, wherein the transistors of at least two said pairs are provided with a respective emitter area mismatch whereby their gain maxima are displaced from said signal zero level.

8. A signal amplifier element as claimed in claim 7, wherein each transistor has a collector load comprising a forward biased diode for temperature compensation.

* * * * *